United States Patent
Madsen et al.

(10) Patent No.: US 9,552,003 B2
(45) Date of Patent: Jan. 24, 2017

(54) ZERO DRIFT, LIMITLESS AND ADJUSTABLE REFERENCE VOLTAGE GENERATION

(71) Applicant: PR Electronics A/S, Rønde (DK)

(72) Inventors: Dan Vinge Madsen, Risskov (DK); Stig Alnøe Lindemann, Højbjerg (DK)

(73) Assignee: PR Electronics A/S, Rønde (DK)

( * ) Notice: Subject to any disclaimer, the term of this patent is extended or adjusted under 35 U.S.C. 154(b) by 0 days.

(21) Appl. No.: 15/094,459

(22) Filed: Apr. 8, 2016

(65) Prior Publication Data

US 2016/0299519 A1    Oct. 13, 2016

(30) Foreign Application Priority Data

Apr. 10, 2015  (DK) ................................ 2015 70208

(51) Int. Cl.
*G05F 1/46* (2006.01)
*H03K 5/007* (2006.01)
(Continued)

(52) U.S. Cl.
CPC .............. *G05F 1/468* (2013.01); *H02M 3/157* (2013.01); *H03F 3/347* (2013.01); *H03F 3/393* (2013.01);
(Continued)

(58) Field of Classification Search
None
See application file for complete search history.

(56) References Cited

U.S. PATENT DOCUMENTS

| 5,914,631 A * | 6/1999 | Soneda ................... G05F 1/465 327/237 |
| 7,068,116 B2 * | 6/2006 | Kato ...................... H03K 3/353 331/111 |

(Continued)

FOREIGN PATENT DOCUMENTS

| EP | 1229656 | 8/2002 |
| EP | 1376295 | 1/2004 |
| WO | 2008082585 | 7/2008 |

*Primary Examiner* — Thomas J Hiltunen
(74) *Attorney, Agent, or Firm* — Dykema Gossett PLLC

(57) ABSTRACT

A circuit for generation of a reference voltage for an electronic system, which circuit comprises at least one digital buffer (U21, U31, U32, U41, U51), a low pass filter (R21, C21; R31, C31; R41, C41; R51, C51) and an operational amplifier (OA21, OA31, OA41, OA51)), which circuit is adapted to revive an input in the form of a bandgap reference voltage into the digital buffer, which digital buffer is adapted to receive a digital input from a Pulse Width Modulated (PWM) signal, which digital buffer is adapted to generate an output signal adapted to be fed to the low pass filter, which output signal after filtration is adapted to be fed to a positive input terminal of the operational amplifier, which operational amplifier comprises a feedback circuit, which feedback circuit comprises at least one capacitor (C22, C32, C44, C54) adapted to be connected from an output terminal of the operational amplifier towards a negative input terminal of the operational amplifier so as to form an integrator, wherein the feedback circuit further comprises at least one chopped signal path (R22, S21; R33, R34, S32; R33, R35, C35, S31), which chopped signal is adapted to be modulated by the output signal of the digital buffer.

5 Claims, 5 Drawing Sheets

(51) Int. Cl.

| | |
|---|---|
| *H03K 7/08* | (2006.01) |
| *H02M 3/157* | (2006.01) |
| *H03F 3/347* | (2006.01) |
| *H03F 3/393* | (2006.01) |
| *H03F 3/45* | (2006.01) |
| *H03G 3/30* | (2006.01) |
| *H03M 1/82* | (2006.01) |

(52) U.S. Cl.
CPC ........ *H03F 3/45475* (2013.01); *H03G 3/3021* (2013.01); *H03K 5/007* (2013.01); *H03K 7/08* (2013.01); *H03M 1/822* (2013.01); *H03F 2200/135* (2013.01); *H03F 2200/144* (2013.01); *H03F 2200/156* (2013.01); *H03F 2200/159* (2013.01); *H03F 2200/165* (2013.01); *H03F 2200/264* (2013.01); *H03F 2200/297* (2013.01); *H03F 2200/351* (2013.01); *H03F 2200/372* (2013.01); *H03F 2200/375* (2013.01); *H03F 2200/528* (2013.01); *H03F 2203/45512* (2013.01); *H03F 2203/45526* (2013.01); *H03F 2203/45528* (2013.01); *H03F 2203/45531* (2013.01); *H03F 2203/45534* (2013.01); *H03F 2203/45536* (2013.01); *H03F 2203/45594* (2013.01); *H03F 2203/45631* (2013.01); *H03F 2203/45701* (2013.01)

(56) References Cited

U.S. PATENT DOCUMENTS

| | | | | |
|---|---|---|---|---|
| 7,154,324 | B1* | 12/2006 | Maangat | H03K 5/133 |
| | | | | 327/284 |
| 7,492,233 | B2* | 2/2009 | Grabinger | H02M 1/08 |
| | | | | 332/109 |
| 7,567,063 | B1* | 7/2009 | Suzuki | G05F 3/08 |
| | | | | 320/166 |
| 8,830,286 | B2* | 9/2014 | Toyoizumi | B41J 2/471 |
| | | | | 347/118 |
| 8,836,382 | B1* | 9/2014 | Lee | H03K 17/162 |
| | | | | 326/60 |
| 8,975,916 | B1 | 3/2015 | Yarlagadde et al. | |
| 9,362,822 | B2* | 6/2016 | Rozek | H02M 3/156 |
| 2008/0143697 | A1* | 6/2008 | Kojima | G09G 3/3688 |
| | | | | 345/204 |
| 2008/0238529 | A1* | 10/2008 | Kumagai | G01K 7/01 |
| | | | | 327/512 |
| 2010/0001704 | A1 | 1/2010 | Williams | |
| 2011/0032027 | A1* | 2/2011 | Dash | G05F 1/56 |
| | | | | 327/539 |
| 2011/0270427 | A1* | 11/2011 | Takahashi | H03K 5/1565 |
| | | | | 700/94 |
| 2013/0119953 | A1 | 5/2013 | Murase | |
| 2014/0247023 | A1 | 9/2014 | Kippley et al. | |
| 2016/0170430 | A1* | 6/2016 | Ueda | G05F 3/02 |
| | | | | 323/304 |

\* cited by examiner ns003 B2

ZERO DRIFT, LIMITLESS AND ADJUSTABLE REFERENCE VOLTAGE GENERATION

FIELD OF THE INVENTION

The present invention relates to a circuit for generation of a reference voltage for an electronic system, which circuit comprises at least one digital buffer, a low pass filter and an operational amplifier, which circuit is adapted to revive an input in the form of a bandgap reference voltage into the digital buffer, which digital buffer is adapted to receive a digital input from a Pulse Width Modulated (PWM) signal, which digital buffer is adapted to generate an output signal adapted to be fed to the low pass filter, which output signal after filtration is adapted to be fed to a positive input terminal of the operational amplifier, which operational amplifier comprises a feedback circuit, which feedback circuit comprises at least one capacitor adapted to be connected from an output terminal of the operational amplifier towards a negative input terminal of the operational amplifier so as to form an integrator.

BACKGROUND OF THE INVENTION

Fixed reference voltage circuitry based on bandgap voltage together with temperature compensation is widespread commercially available in the form of serial and shunt voltage regulators, and offers an initial accuracy typically down to 0.025% and a temperature drift of 2 ppm/C.

Often, reference voltages different from the standardized voltages are needed and in some cases even a stabilized, variable reference voltage is required. Typically, a stabilized reference voltage is obtained by resistor division as in FIG. 1, which can create an output voltage higher than the bandgap reference voltage. To ensure high initial accuracy and temperature drift corresponding to the bandgap reference specifications, the resistors (R2 and R3 in FIG. 1) shall be of very high precision with respect to the initial resistor value and have a very low temperature drift. Resistors of high precision and low temperature drift are very costly and typically cause the circuit to be economically non-viable.

US2014247023A1 discloses a technique to reduce the influence of resistor precision and temperature drift by adding an additional bandgap reference.

The present invention discloses a technique to obtain a reference voltage whose precision and drift are independent of the resistors in the circuit and which is without limits relative to the bandgap voltage, i.e., it can be above or below the bandgap voltage.

OBJECTS OF THE INVENTION

It is the object of the invention to generate a reference voltage in a cost-effective way and to be able to vary the reference value in a well-defined way, independently of the bandgap voltage. The invention ensures a stable and low-drift reference voltage generation by means of low cost components. Furthermore, the reference voltage can be adjusted by a duty cycle of the PWM signal.

DESCRIPTION OF THE INVENTION

The objects of the invention can be achieved by a circuit as disclosed in the preamble of claim 1 and further modified in that the feedback circuit further comprises at least one chopped signal path, which chopped signal is adapted to be modulated by the output signal of the digital buffer.

Hereby, it can be achieved that the steady state operational amplifier output voltage (Vref) can be varied from 0 V to infinite (only limited by the operational amplifier), wherein the output voltage (Vref) is only dependent on the duty cycle (D) of the PWM signal and the bandgap voltage (Vbandgap) according to the following formula:

$$Vref = \frac{Vbandgap \cdot D}{1-D}$$

In a preferred embodiment of the invention, the feedback circuit comprises two individual out of phase chopped signal paths, wherein one signal path is adapted to determine a direct current of an output voltage and the other signal path is adapted to cancel the triangular signal behaviour of the operational amplifier due to the currents flowing in the two paths in opposite directions. Hereby, it can be avoided that the operational amplifier performs integration of the signal.

In a further preferred embodiment of the invention, the operational amplifier is a zero-drift operational amplifier adapted to eliminate the temperature drift of an offset voltage drift of the operational amplifier. Hereby, the circuit can operate independently of change in temperature.

In a further preferred embodiment of the invention, a single pole dual throw switch is adapted to perform the chopping of the signal paths. Hereby, a simplified circuit can be achieved, where fewer components have influence on the temperature drift.

In a further preferred embodiment of the invention, two MOSFET transistors are adapted to perform the chopping of the two signal paths. Hereby, a very fast chopping can be achieved.

The present invention makes use of a PWM signal to create a cost-effective, stable, precise, adjustable and low-drift reference voltage, which can be used for typical analog signal conditioning and for analog-to-digital conversion.

As most electronic constructions require/include a microprocessor, the availability of a PWM signal, which is inherent in most microprocessors, is high. The reference voltage generation is determined by the voltage supplied to a buffer/inverter within the circuit and the duty cycle of the PWM.

The present invention makes use of a PWM signal to obtain a highly stable, low drift reference voltage as described in FIG. 2. The reference voltage is given by:

$$Vref = \frac{Vbandgap \cdot D}{1-D}$$

where Vbandgap is the voltage supply for the buffer (U21) typically generated by a voltage reference diode based on temperature compensated bandgap voltage, and D is the duty cycle of the PWM signal.

Based on the assumption of an ideal operational amplifier (OA21) and an ideal switch (S21), the passive components within the circuit (R21, C21, C22, R22 and C23) do not have any influence on the accuracy and drift of the reference voltage Vref.

The stability of the duty cycle of the PWM is important for the stability of the reference voltage (Vref). For microprocessors, the duty cycle of PWM signals is based on counters which count a fixed number of clock periods of the microprocessor system clock for the "low" PWM period and typically another fixed number of clock periods for the "high" PWM period. The microprocessor system clock is based on either a crystal or a simple Resistor-Capacitor (RC) oscillator, wherein for both types of oscillator a very high degree of short term stability (phase stability) is given due to a very high quality factor of the oscillator. Long term variations of the clock frequency due to temperature and aging will not have any influence on the duty cycle, as the latter is determined by the counted clock cycles for "high" PWM signal and the succeeding counted clock cycles for "low" PWM signal.

The implementation given in FIG. 2 may suffer from the fact that the capacitance (C23) may cause the operational amplifier to exhibit instability; furthermore, the output of the operational amplifier may exhibit a triangular behaviour with the frequency of the PWM signal due to the position of the switch (S21). The output of the operational amplifier (OA21) may increase when the switch (S21) is connected to the ground and decrease when the switch (S21) is connected to the output of the operational amplifier (OA21) due to the integration behaviour of the operational amplifier's coupling.

In FIG. 3, it is disclosed an implementation where the operational amplifier instability is avoided by resistor (R32), which may be in the range of 100 ohm. The triangular output behaviour of the operational amplifier is reduced/cancelled by the dual switch strings formed by:

String 1: a resistor (R34) and a switch (S32); and
String 2: a resistor (R35), a switch (S31) and a capacitor (C35).

The two strings are driven out of phase with respect to each other by the inverter (U32). The currents within the two strings will be equal in level, given that the impedance of the capacitor (C35) is much smaller than the impedance of the resistor (R35) and the two resistors (R34 and R35) are equal, and opposite in direction, causing the resulting current within the resistor (R33) to be null and thereby avoiding the triangular behaviour of the operational amplifier's output.

The direct current (DC) component of the reference voltage (Vref) is only determined by the primary string (R34 and S32).

The capacitor (C34) is used to reduce switching noise from the two switches (S31 and S32) causing noise at the output of the operational amplifier.

Alternatively, more cost-effective implementations are given in FIG. 4 and FIG. 5. In FIG. 4, the two switches have been reduced to only one Single Pole Dual Throw (SPDT) switch. In FIG. 5, the switching functionality is obtained by two MOSFET transistors. For both implementations, the resistors (R47 and R57) will cause a temperature drift since the latter will not be nulled out by the circuit's behaviour. The resulting temperature drift on the reference voltage occurring from the resistors' drift of (R47 and R57) can though be reduced dramatically by a proper design as the temperature coefficient on the reference voltage generation for the implementation in FIG. 4 can be calculated as:

$$TC_{Vref} = \frac{D \cdot R47}{R45 + R46 + R47 \cdot D} \cdot TC_{R47}$$

where:
$TC_{R47}$ is the temperature coefficient of the resistor (R47);
D is the duty cycle of the PWM signal; and
R45, R46, and R47 are the nominal values of the respective resistors.

Selecting the sum of the resistors (R45 and R46) significantly larger than the resistor (R47), the temperature coefficient of the reference voltage can be approximated to:

$$TC_{Vref} \approx \frac{D \cdot R47}{R45 + R46} \cdot TC_{R47}$$

The effect of the temperature coefficient of the resistor (R47) is reduced by the factor given in the above formula. For a duty cycle of 0.5 and a ratio between R47 and the sum R45 and R46 of 10, the influence of the resistor's temperature coefficient on the reference voltage (Vref) will be reduced by a factor 20.

Another contribution to the temperature coefficient of the reference voltage is the offset voltage temperature drift of the operational amplifier (OA21, OA31, OA41 and OA51), which can reduced by used of a zero-drift operational amplifier (chopped amplifier).

DETAILED DESCRIPTION OF THE INVENTION

Figure 1:
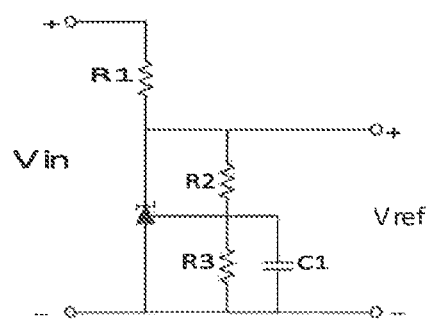
FIG. 1 discloses the prior art of creating a reference voltage.

FIG. 1 discloses the prior art of creating a reference voltage which differs from the standardized bandgap references.

Figure 2:
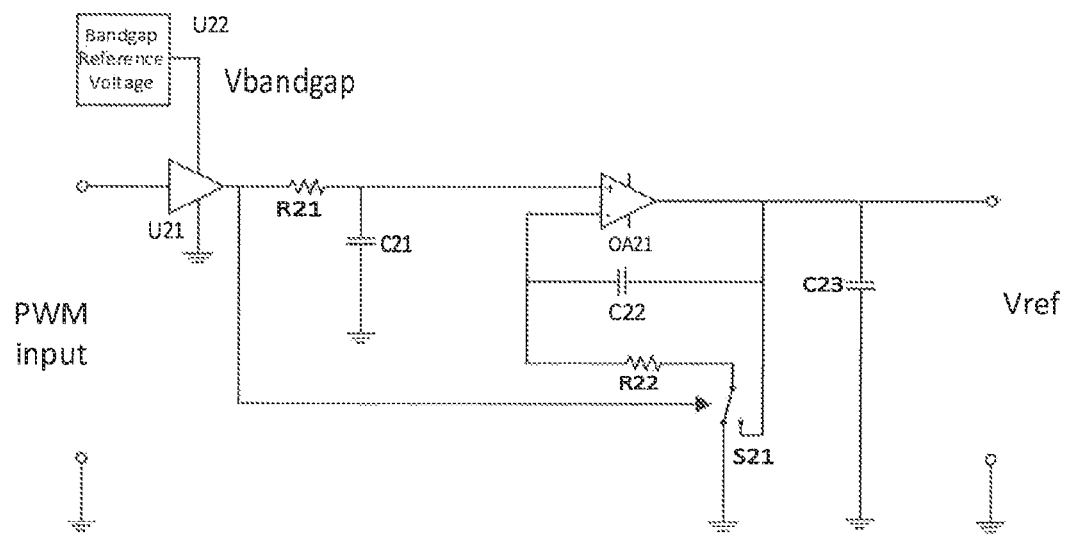
FIG. 2 discloses a simplified implementation of the variable reference voltage generator.

FIG. 2 discloses a simplified implementation of the variable reference voltage generator, where the power supply for the buffer (U21) is a stable voltage with an accuracy and stability given by the bandgap reference voltage device (U22). The low pass filter (R21 and C21) creates an average input voltage for the operational amplifier of (Vbandgap D). The switch (S21) is controlled by the PWM signal and creates a gain within the operational amplifier of (1/(1−D)), where (D) is the duty cycle of the PWM signal. The capacitor (C23) stabilizes on a short term and reduces the high frequency noise from the PWM input signal at the output voltage Vref.

Figure 3:
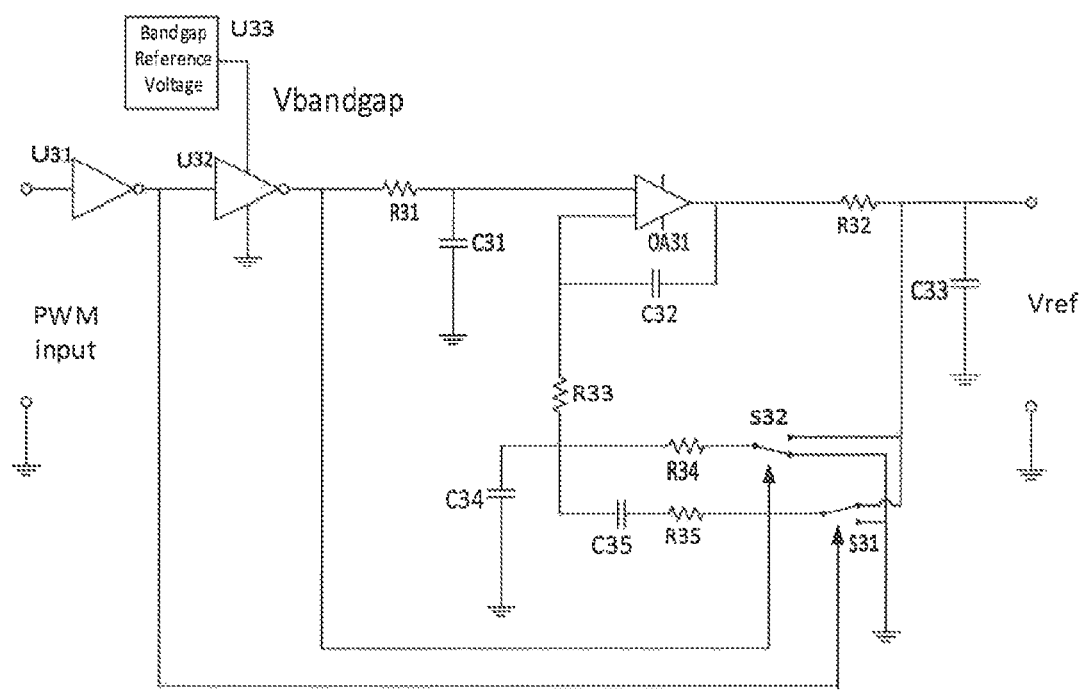
FIG. 3 discloses an implementation including a resistor R32 that avoids instability of the operational amplifier.

FIG. 3 discloses an implementation including a resistor R32 that avoids instability of the operational amplifier due to the large capacitor C33. Furthermore, a dual structure comprising (R34 and S32) and (C35, R35 and S31) is implemented, which first structure (R34 and S32) defines the direct current gain of the operational amplifier on the basis of the duty cycle, whereas the latter structure (C35, R35 and S31) generates an oppositely directed current within R33 causing the triangular behaviour of the output signal of the operational amplifier to be cancelled.

Figure 4:
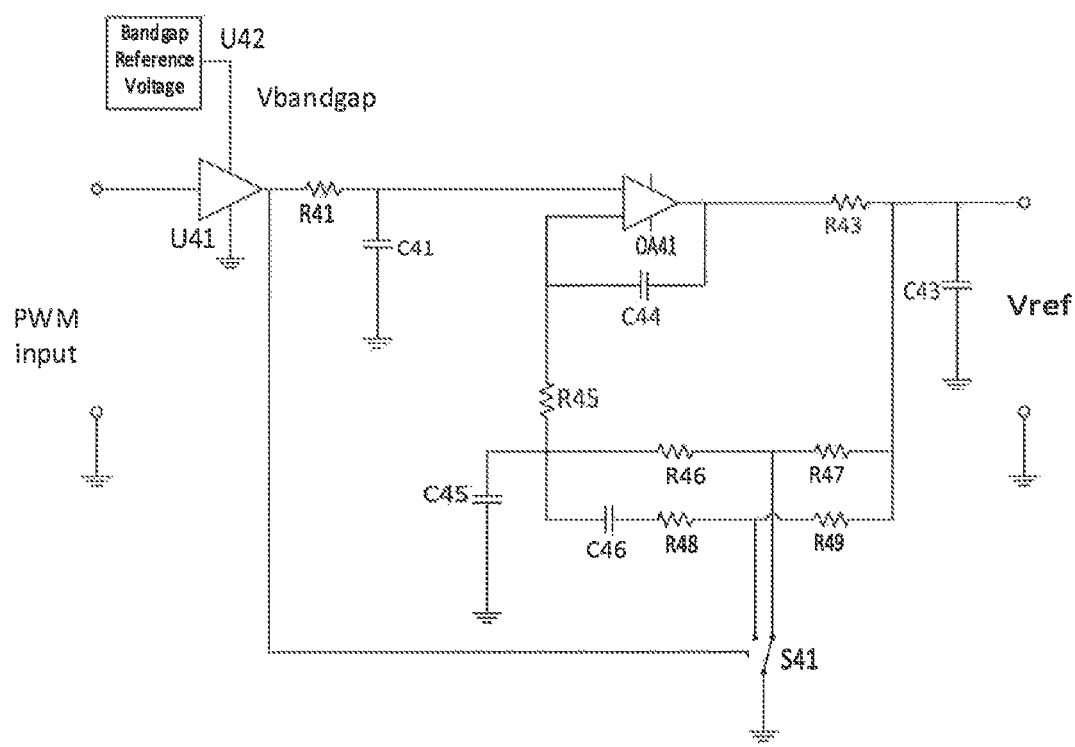
FIG. 4 discloses an implementation using only one SPDT switch.

FIG. 4 discloses an implementation using only one SPDT switch (S41) and only one buffer (U41). The purpose of the resistors (R47 and R49) is to limit the output current of the operational amplifier. The temperature drift of resistor (R47) is reduced by the factor: R47/(R47+R46). For an implementation where R46 is significant larger than R47, the temperature drift of the resistor (R47) is dramatically reduced.

Figure 5:
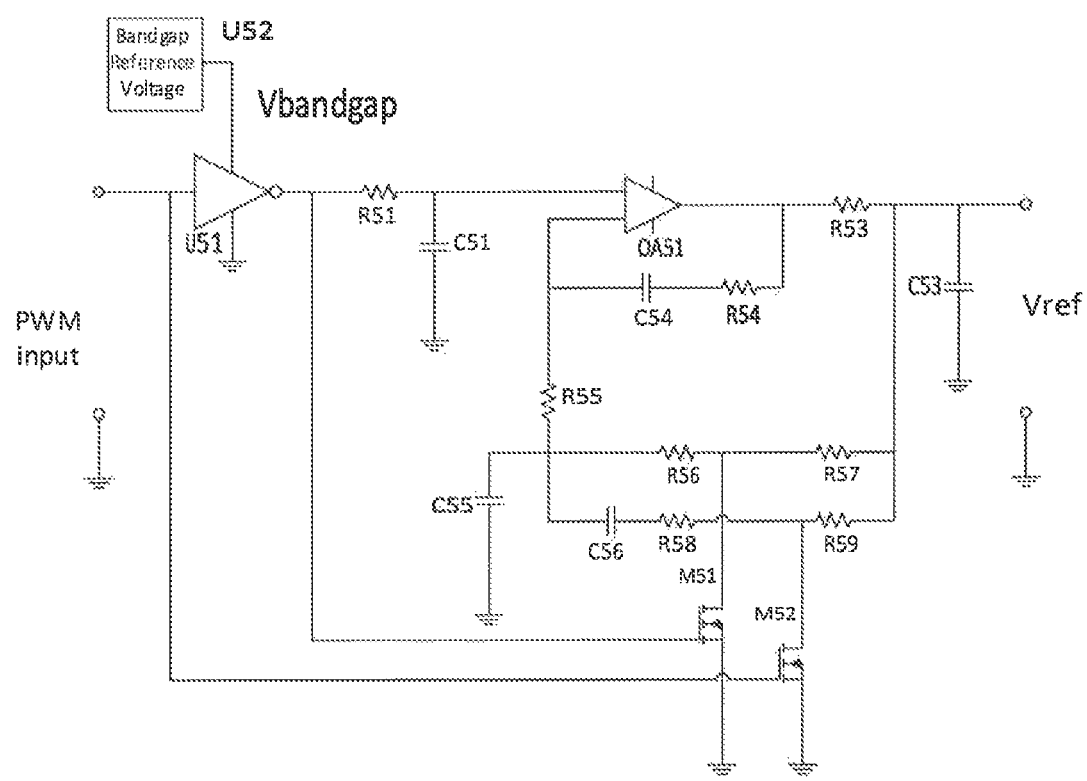
FIG. 5 discloses an implementation using two MOSFET transistors as switches.

FIG. 5 discloses an implementation using two MOSFET transistors as switches to employ a cost-effective implementation. Using an inverter as PWM signal buffer enables the two inverted PWM signals for the two MOSFETs.

The invention claimed is:

1. A circuit for generation of a reference voltage for an electronic system, which circuit comprises at least one digital buffer (U21, U31, U32, U41, U51), a low pass filter (R21, C21; R31, C31; R41, C41; R51, C51) and an operational amplifier (OA21, OA31, OA41, OA51), which circuit is adapted to revive an input in the form of a bandgap reference voltage into the digital buffer, which digital buffer is adapted to receive a digital input from a Pulse Width Modulated (PWM) signal, which digital buffer is adapted to generate an output signal adapted to be fed to the low pass filter, which output signal after filtration is adapted to be fed to a positive input terminal of the operational amplifier, which operational amplifier comprises a feedback circuit, which feedback circuit comprises at least one capacitor (C22, C32, C44, C54) adapted to be connected from an output terminal of the operational amplifier towards a negative input terminal of the operational amplifier so as to form an integrator, whereby the feedback circuit further comprises at least one chopped signal path (R22, S21; R33, R34, S32; R33, R35, C35, S31), which chopped signal is adapted to be modulated by the output signal of the digital buffer.

2. The circuit for generation of the reference voltage according to claim 1, wherein the feedback circuit comprises two individual out of phase chopped signal paths, wherein one signal path (R33, R34, S32) is adapted to determine a direct current of an output voltage and the other signal path (R33, R35, C35, S31) is adapted to cancel the triangular signal behaviour of the operational amplifier due to the currents flowing in the two paths in opposite directions.

3. The circuit for generation of the reference voltage according to claim 2, wherein the operational amplifier (OA21, OA31, OA41, OA51) is a zero-drift operational amplifier adapted to eliminate the temperature drift of an offset voltage drift of the operational amplifier.

4. The circuit for generation of the reference voltage according to claim 3, wherein a single pole dual throw switch (S41) is adapted to perform the chopping of the signal paths.

5. The circuit for generation of the reference voltage according to claim 2, wherein two MOSFET transistors (M51, M52) are adapted to perform the chopping of the two signal paths.

* * * * *